(12) United States Patent
Kobayashi et al.

(10) Patent No.: US 7,333,682 B2
(45) Date of Patent: Feb. 19, 2008

(54) PHOTOELECTRIC COMPOSITE INTERCONNECTION ASSEMBLY AND ELECTRONICS DEVICE USING SAME

(75) Inventors: Masahiko Kobayashi, Hitachi (JP); Akihiro Hiruta, Hitachi (JP)

(73) Assignee: Hitachi Cable, Ltd., Tokyo (JP)

( * ) Notice: Subject to any disclaimer, the term of this patent is extended or adjusted under 35 U.S.C. 154(b) by 122 days.

(21) Appl. No.: 11/230,919

(22) Filed: Sep. 21, 2005

(65) Prior Publication Data

US 2006/0067608 A1 Mar. 30, 2006

(30) Foreign Application Priority Data

Sep. 22, 2004 (JP) ............... 2004-274671

(51) Int. Cl.
*G02B 6/12* (2006.01)
(52) U.S. Cl. .................. 385/14; 385/9; 385/15; 385/18; 385/24; 385/49
(58) Field of Classification Search .................. 385/14, 385/49
See application file for complete search history.

(56) References Cited

U.S. PATENT DOCUMENTS

| | | | | |
|---|---|---|---|---|
| 4,508,399 A | * | 4/1985 | Dowling et al. ............... | 439/67 |
| 5,054,870 A | * | 10/1991 | Losch et al. .................. | 385/14 |
| 6,088,498 A | * | 7/2000 | Hibbs-Brenner et al. ...... | 385/52 |
| 6,229,712 B1 | * | 5/2001 | Munoz-Bustamante et al. .......................... | 361/783 |
| 6,611,635 B1 | * | 8/2003 | Yoshimura et al. ........... | 385/14 |
| 6,797,891 B1 | * | 9/2004 | Blair et al. .................. | 174/268 |
| 6,914,231 B1 | * | 7/2005 | Stone ......................... | 250/216 |
| 7,136,551 B2 | * | 11/2006 | Cho et al. ..................... | 385/31 |
| 2004/0218848 A1 | * | 11/2004 | Shen et al. ................... | 385/14 |
| 2006/0002663 A1 | * | 1/2006 | Posamentier ................. | 385/88 |

FOREIGN PATENT DOCUMENTS

| | | |
|---|---|---|
| JP | 9-96746 | 4/1997 |
| JP | 10-186187 | 7/1998 |
| JP | 2002-182048 | 6/2002 |

\* cited by examiner

*Primary Examiner*—Frank G. Font
*Assistant Examiner*—Eric Wong
(74) *Attorney, Agent, or Firm*—McGinn IP Law Group, PLLC

(57) ABSTRACT

A photoelectric composite interconnection assembly having: a flexible substrate having an electric interconnection; and an electrical interface provided at both ends of the electric interconnection. A part of the electric interconnection is replaced by an optical transmission line.

15 Claims, 11 Drawing Sheets

PHOTOELECTRIC COMPOSITE INTERCONNECTION ASSEMBLY AND ELECTRONICS DEVICE USING SAME

The present application is based on Japanese patent application No. 2004-274671, the entire contents of which are incorporated herein by reference.

BACKGROUND OF THE INVENTION

1. Field of the Invention

This invention relates to a photoelectric composite interconnection assembly and, particularly, to a photoelectric composite interconnection assembly with flexibility, and further relates to an electronics device using the same.

2. Description of the Related Art

The developments of high-speed and high-capacity communication technology are actively advanced with expansion of services and applications for handling high-capacity data such as picture images in telecommunication equipment such as personal computers and cellular phones. Under the circumstances, the developments of interconnections that allow high-speed and high-capacity communications at a high density inside an electronics device or among electronics devices attract attention.

A conventional electric cable 1000 with electric connectors 103 is shown in FIG. 1A wherein the same parts are designated by the identical reference numerals, respectively. In the electric cable 1000 with electric connectors 103, electric interconnections 102 are formed on a flexible substrate 101, and the electric connectors 103 are provided at both ends of the flexible substrates 101. When the flexible electric cable 1000 with the electric connectors 103 is applied, an electrical interface may be achieved freely through interconnections between substrates or electronic modules constituting electronics devices.

FIG. 1B shows an electric cable 1002 of card edge type wherein electric interconnections 102 are formed on a flexible substrate 101, and electrodes 1001 are provided at either or both of the ends of the substrate 101.

The card edge type electric cable 1002 may be fitted directly to a connector on the other end of a line without providing electric connector parts on the flexible substrate side, so that it is not required to solder the parts on the flexible substrate 101. Accordingly, a high-density and thin electric cable can be realized at a low cost.

Next, conventional optical interconnection assemblies are shown in FIGS. 2, 3, and 4, respectively.

FIG. 2 shows a constitution wherein polymer waveguides 1101 are formed on a flexible substrate 101, and further PDs 1102, amplifiers 1103 and the like are integrated, whereby optical signals are transmitted (for example, see FIG. 8, page 9 of Japanese Patent Application Laid-Open No. 9-96746).

FIG. 3 shows a constitution wherein a polymer waveguide 1201 is used as its optical transmission line, and substrates (connectors) for optical connection 1202 are provided at both ends of the polymer waveguide 1201 (for example, see FIG. 1, page 6 of Japanese Patent Application Laid-Open No. 10-186187).

FIG. 4 shows a polymer waveguide film 1303 for connecting in between an external multi-core optical connector 1301 and multi-channel optical element arrays 1302 (for example see FIG. 13, page 10 of Japanese Patent Application Laid-Open No. 2002-182048). The polymer waveguide film 1301 is provided with a connector interface 1304 connected optically with the external multi-core optical connector 1301.

However, the conventional electric interconnection assemblies or optical interconnection assemblies involve the following problems.

In the conventional electric interconnection assemblies, an electric interconnection is required to reduce its diameter with a tendency of high density. In this respect, however, an electric interconnection having a small diameter brings about a high electrical resistance. Besides, its transmission loss in high frequency becomes remarkable, so that speedup in communications is difficult. Moreover, it is also difficult to assure accurately an appropriate characteristic impedance of an electric interconnection because of a manufacturing deviation in sizing. A limit of transmission rate in this case is usually around several hundreds Mbit/second. Furthermore, there are problems of generation of electromagnetic noises or being easily affected adversely by electromagnetic noises due to an electric interconnection system. In this connection, there is an electric interconnection assembly with a coaxial structure. Although such a coaxial structure is excellent in electromagnetic noise proof strength, there is still no perfect means for solving the electromagnetic noise problem. Thus, there is a slight generation of electromagnetic noises, and even such slight electromagnetic noises, they result in a problem in telecommunication equipment wherein weak electrical signals are handled. In addition, it is difficult for the coaxial structure to achieve a miniaturization and a high-density fabrication.

On the other hand, the conventional optical interconnection assemblies have such a constitution that the polymer waveguides 1101 and optical waveguides 1104 being connected through an optical modulator 1107 thereto are formed on the flexible substrate 101, and PDs 1102, amplifiers 1103 and the like are further integrated as well as providing an electrode or electric interconnection for driving the PDs 1102, the amplifiers 1103 and the like on the flexible substrate 101 wherein optical signals are transmitted through the polymer waveguides 1001, the optical signals are photoelectric-converted in the photodetectors (PDs) 1102 to amplify the signals thus converted in the amplifiers 1103. In this case, an optical fiber 1105 is connected as an interface to the outside so as to function as an optical transmission line.

For a connecting section 1106 with the optical fiber 1105, however, a reduction in its cost is difficult, because it is necessary for an accurate position alignment of from around a submicron to several microns. In addition, there is such a problem that if a fine dust enters into the connecting section 1106, its optical connection loss becomes high, whereby a transmission quality deteriorates significantly.

SUMMARY OF THE INVENTION

It is an object of the invention to provide a photoelectric composite interconnection assembly that develops an easy handling ability like ordinary electric cables with an electric connector while exhibiting excellent flexibility.

It is a further object of the invention to provide a photoelectric composite interconnection assembly that radiates little electromagnetic noise and has excellent noise resistance while allowing high-speed, high-capacity and high quality information transmission.

According to the invention, a photoelectric composite interconnection assembly comprises:
 a flexible substrate comprising an electric interconnection; and
 an electrical interface provided at both ends of the electric interconnection;

wherein a part of the electric interconnection is replaced by an optical transmission line.

The following modifications or changes may be made in the abovementioned invention.

(i) The electric interconnection is formed on the flexible substrate and replaced by the optical transmission line at an intermediate section thereof, and the optical transmission line comprises a pair of optical element sections and a flexible optical waveguide that optically connects between the pair of optical element sections.

(ii) The electrical interface comprises an electric connector and/or an electrode, and the electrode is connectable with an external card edge connector.

(iii) The pair of optical element sections comprises an electro-optic (E/O) conversion section and an opto-electric (O/E) conversion section, the electro-optic (E/O) conversion section is electrically connected to the electrical interface provided at the one end of the electric interconnection, the opto-electric (O/E) conversion section is electrically connected to the electrical interface provided at the other end of the electric interconnection, and the optical waveguide is disposed between the electro-optic (E/O) conversion section and the opto-electric (O/E) conversion section to optically connect therebetween.

(iv) The electro-optic (E/O) conversion section comprises a surface emitting laser.

(v) The surface emitting laser is flip-chip mounted on the flexible substrate.

(vi) The pair of optical element sections comprises plural pairs of optical element sections formed on the flexible substrate, and each of the plural pairs of optical element sections forms an optical transmission line with the corresponding flexible optical waveguide optically connecting between the pair of optical element sections.

(vii) The photoelectric composite interconnection assembly further comprises: a multiplexer for multiplexing plural electric signals provided between the electrical interface and the electro-optic (E/O) conversion section, and a demultiplexer for demultiplexing multiplexed electric signals provided between the electrical interface and the opto-electric (O/E) conversion section.

(viii) The photoelectric composite interconnection assembly further comprises: a multiplexer for multiplexing plural electric signals externally connected to the electrical interface provided on the side of the electro-optic (E/O) conversion section, and a demultiplexer for demultiplexing multiplexed electric signals externally connected to the electrical interface on the side of the opto-electric (O/E) conversion section.

(ix) The photoelectric composite interconnection assembly further comprises: a terminating resistance provided on the flexible substrate.

According to another aspect of the invention, an electronics device comprises:

the abovementioned photoelectric composite interconnection assembly, wherein the photoelectric composite interconnection assembly forms a transmission line between substrates or electronic modules that compose the electronics device.

Features of the Invention

In summary, the invention directs to photoelectric composite interconnection assembly wherein high-speed signals are transmitted through a transmission channel formed from a flexible substrate, an electro-optic (E/O) conversion section, an opto-electric (O/E) conversion section, and an optical waveguide.

By the photoelectric composite interconnection assembly of the invention, communications between electronic modules in electronics devices, or communications between electronics devices themselves can be effected with good handling ability like the ordinary electric cable with electric connectors or the electric cable with electrodes connectable to card edge connectors, and excellent flexibility can be also obtained.

Moreover, according to the invention, since high-speed signals can be transmitted through the optical waveguide, noise resistance can be significantly improved while conducting high-speed, high-capacity and high-quality information transmission.

Furthermore, with the multiplexer and demultiplexer provided on the photoelectric composite interconnection assembly, multiplexed signals can be transmitted to allow a remarkable increase in transmission capacity. In this case, if the transmission capacity may be kept constant, the number of interconnections for optical signals can be reduced, and the number of the expensive electro-optic (E/O) conversion section and opto-electric (O/E) conversion section can also be reduced, and it is advantageous for lowering a cost.

Furthermore, when the photoelectric composite interconnection assembly is provided with plural electric connectors or electrodes connectable to a card edge connector, a freedom in interconnecting can be enhanced, whereby flexibility can be further improved. Thus, the connection between multiported electronics devices becomes easy.

By disposing a reflection member in the light emission direction of a light emitting element as the electro-optic (E/O) conversion element, surface emitting type light emitting elements such as FP-LD and DFB-LD can be used.

When a termination resistance is provided in the vicinity of the electro-optic (E/O) conversion section or the opto-electric (O/E) conversion section, reflection of electric signals can be suppressed. Thus, quality of transmission can be enhanced to facilitate high-speed and high-capacity transmission.

BRIEF DESCRIPTION OF THE DRAWINGS

The present invention will be explained in more detail in conjunction with appended drawings, wherein.

DESCRIPTION OF THE PREFERRED EMBODIMENTS

Preferred embodiments of the present invention will be described hereinafter by referring to the accompanying drawings.

Figure 1A:
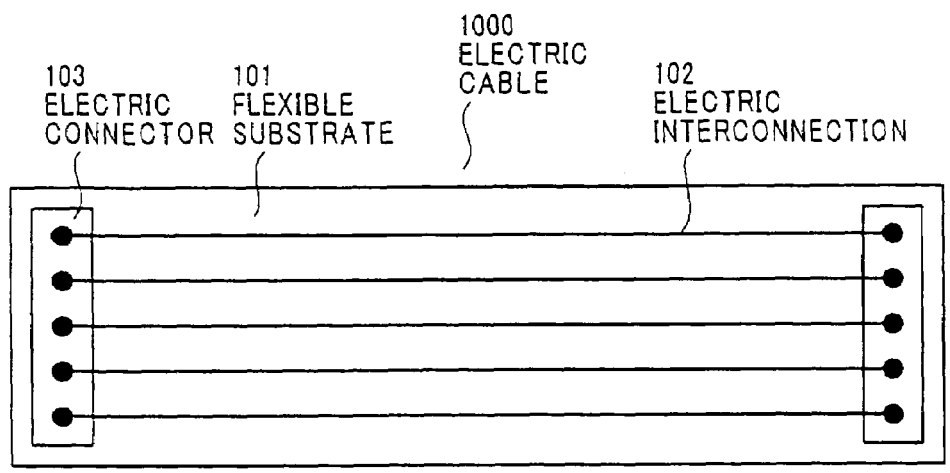
FIG. 1A is a top view showing the whole construction of a conventional electric cable with an electric connector.
Figure 1B:
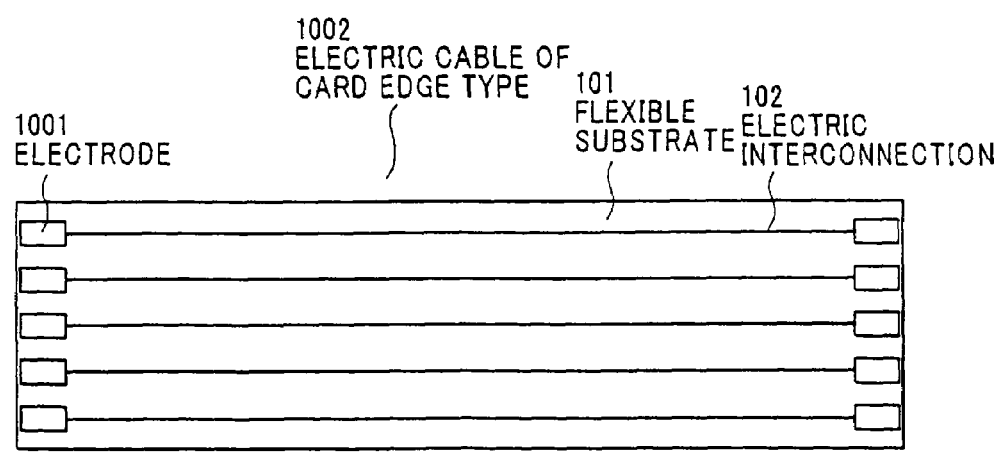
FIG. 1B is a top view showing the whole construction of a conventional electric cable for a card edge type connector.
Figure 2:
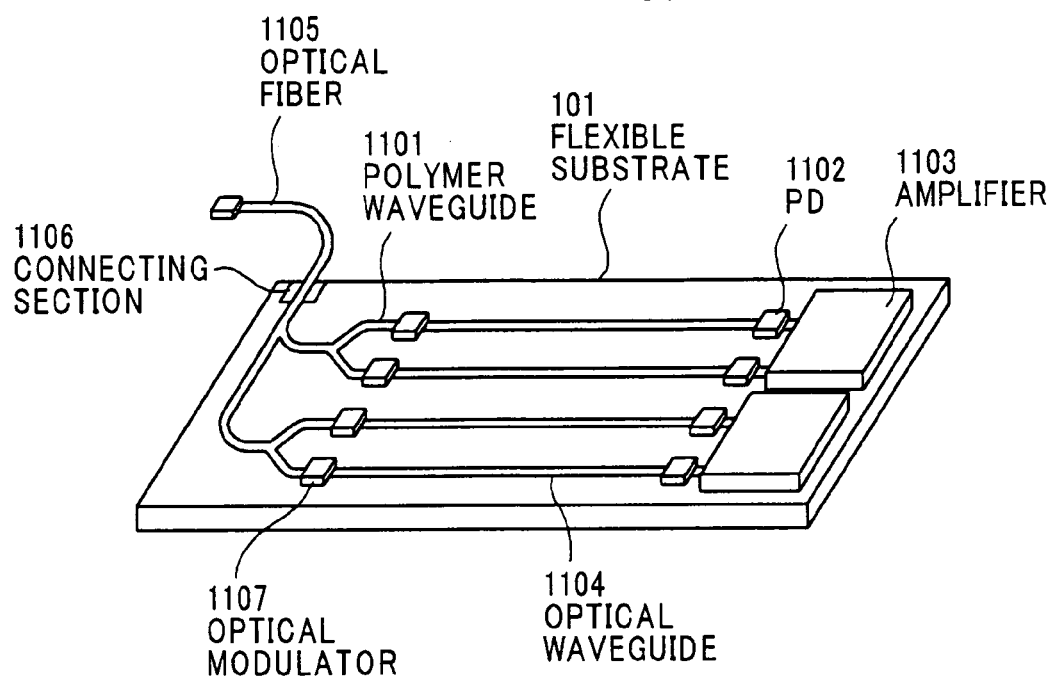
FIG. 2 is a perspective view showing the whole construction of a conventional optical interconnection assembly (active optical circuit sheet)
Figure 3:
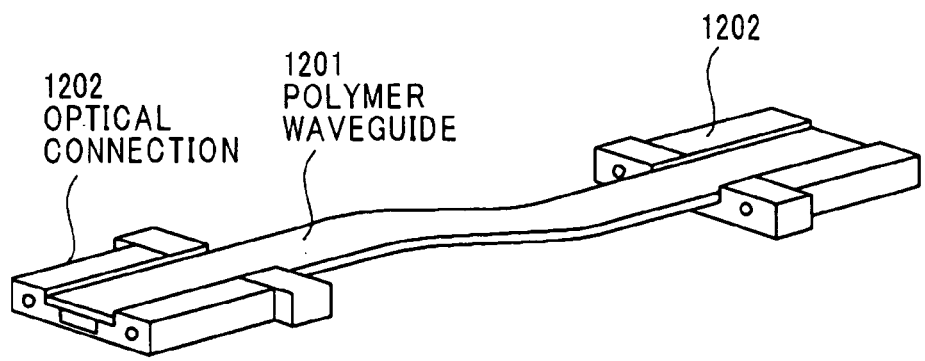
FIG. 3 is a perspective view showing the whole construction of a conventional optical interconnection assembly (flexible optical waveguide device)
Figure 4:
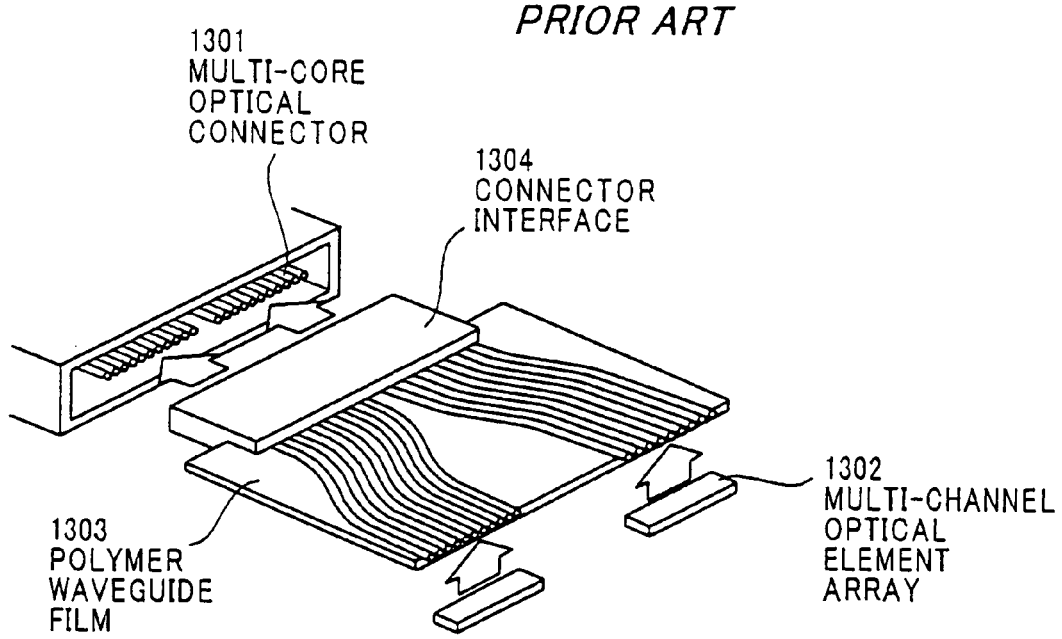
FIG. 4 is a perspective view showing the whole construction of a conventional optical interconnection assembly (flexible optical waveguide film)
Figure 5:
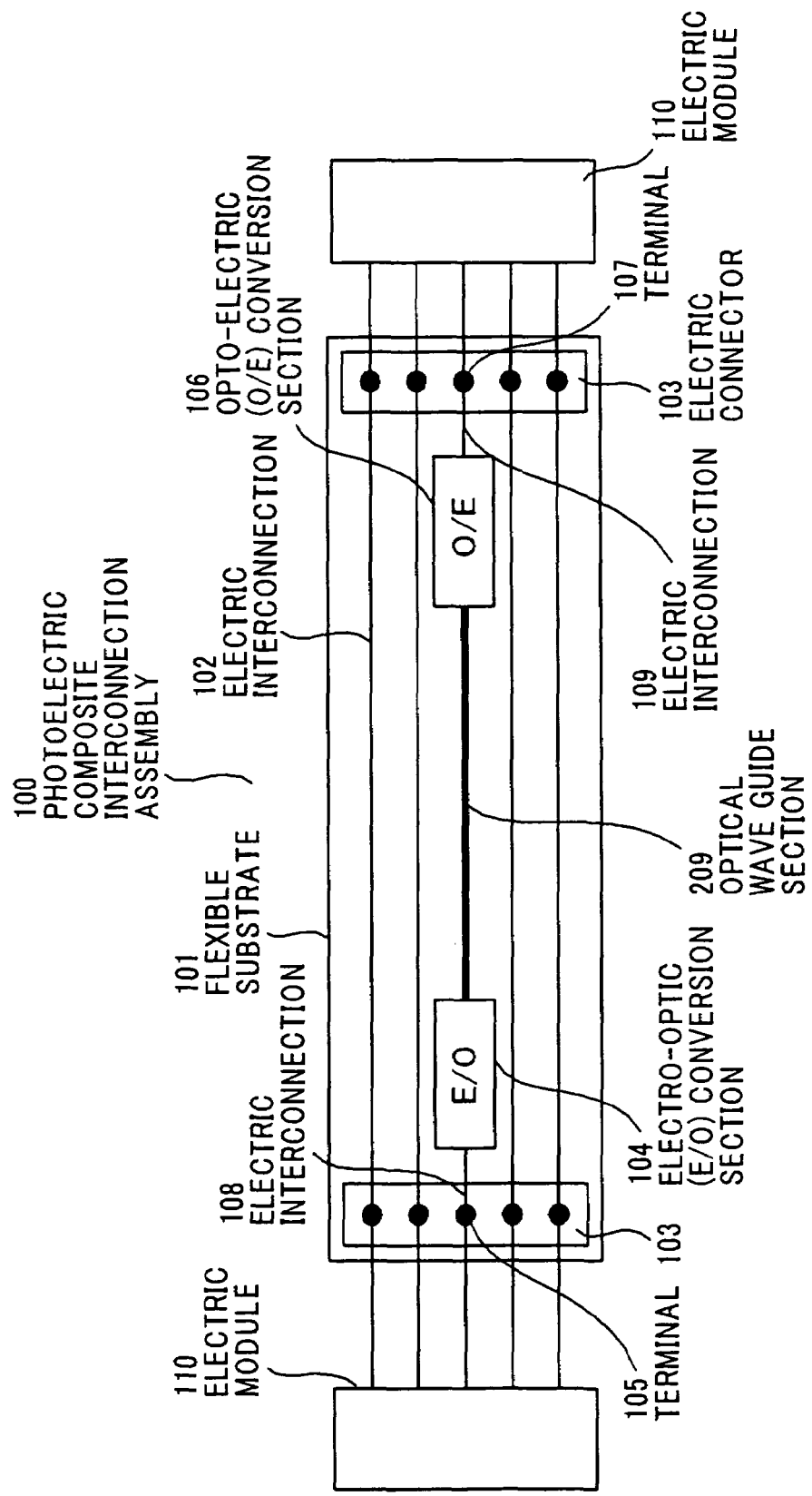
FIG. 5 is a top view showing the whole construction of a photoelectric composite interconnection assembly according to the invention.
Figure 6:
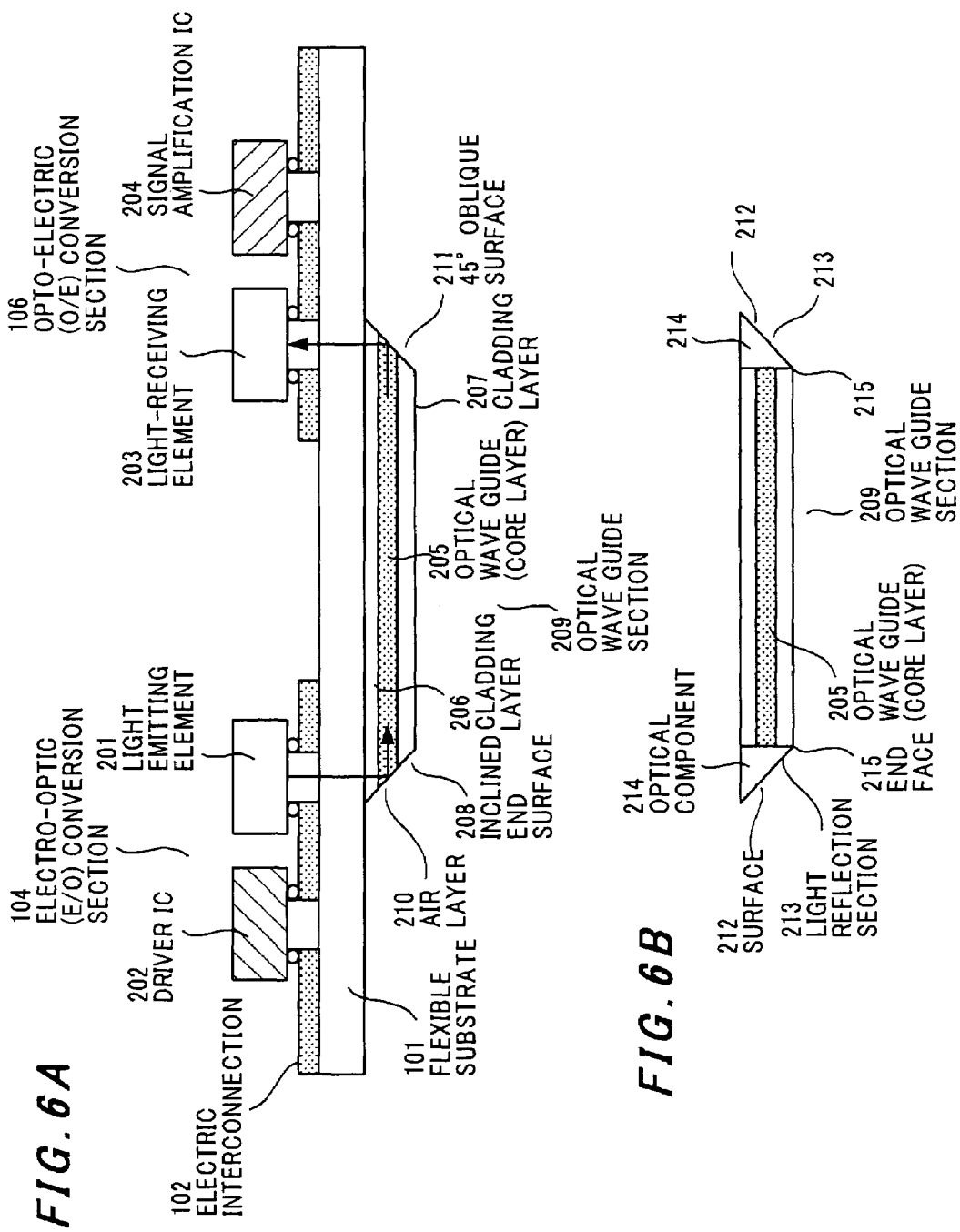
FIG. 6A is a cross sectional view showing an example of a photoelectric composite interconnection assembly according to the invention.
FIG. 6B is a cross sectional view showing another example of a photoelectric composite interconnection assembly according to the invention.

FIG. 5 is a top view showing the whole construction of a photoelectric composite interconnection assembly 100 of the invention, and FIG. 6A is a sectional view showing the photoelectric composite interconnection assembly 100 of the invention.

In the photoelectric composite interconnection assembly 100, electric interconnections 102 made of a copper material are provided on a flexible substrate 101 having flexibility and optical transparency, and electric connectors 103 each having a plurality of terminals are provided at both ends of the flexible substrate 101. The electric connector 103 interfaces in between respective electronic modules to transmit electrical signals between them. A polymer material is desirable as a material for the flexible substrate 101 having flexibility and optical transparency, and a specific example of the polymer material includes polyimide, epoxy, silicone, and acrylic polymers.

Furthermore, an electro-optic (E/O) conversion section 104 composed of a light emitting element 201 being an optical device and a driver IC 202 for driving/controlling the light emitting element 201 is provided in the vicinity of one of the electric connectors 103 (positioned on the left side in FIG. 5), and the light emitting element 201 and the driver IC 202 of the electro-optic (E/O) conversion section 104 are flip chip bonded on the flexible substrate 101 having flexibility and optical transparency, whereby the electro-optic (E/O) conversion section 104 is electrically connected to one of terminals 105 in the electric connector 103 through an electric interconnection 108. In the present embodiment, a structure wherein a surface emitting laser (VCSEL) is used as the light emitting element 201 is shown.

Moreover, an opto-electric (O/E) conversion section 106 composed of a light receiving element 203 and a signal amplification IC 204 is provided in the vicinity of the other electric connector 103 (positioned on the right side in FIG. 5) in the photoelectric composite interconnection assembly 100. The light receiving element 203 and the signal amplification IC 204 of the opto-electric (O/E) conversion section 106 are flip chip bonded on the substrate 101 having flexibility and optical transparency, whereby the opto-electric (O/E) conversion section 106 is electrically connected to one of terminals 107 in the electric connector 103 through an electric interconnection 109. It is desirable to protect these optical devices and their junctions by bonding (not shown) the electro-optic (E/O) conversion section 104 and the opto-electric (O/E) conversion section 106 with the use of a resin such as silicone in order to elevate its reliability.

A flexible optical waveguide 205 for propagating optical signals is provided on the bottom surface the flexible substrate 101 in an area extending from the electro-optic (E/O) conversion section 104 to the opto-electric (O/E) conversion section 106. A length of the optical waveguide 205 is several cm to several ten cm or more, while both of a length of the electric interconnection 108 between the electro-optic (E/O) conversion section 104 and the electric connector 103, and a length of the electric interconnection 109 between the opto-electric (O/E) conversion section 106 and the electric connector 103 are around several mm each.

Accordingly, since a length of the electric interconnection section for transmitting high-speed electric signals is short to be around several mm, deterioration of signals due to transmission is slight, whereby influences derived from electromagnetic noises can be reduced.

In addition, high-speed electric signals are converted from electric signals into optical signals in the electro-optic (E/O) conversion section 104, and then, the signals thus converted are propagated through the optical waveguide 205 occupying the major part of a length of the transmission channel. Accordingly, influences of electromagnetic noises can be eliminated, and further a high-capacity data can be transmitted. A polymer material is desirably used for a material of the optical waveguide, and a specific example thereof includes polyimide, epoxy, silicone, and acrylic polymers. In this case, the flexible substrate and the flexible optical waveguide for propagating optical signals may be subjected to one-piece molding.

Next, a fabrication method for the parts will be described hereinafter.

A polymer material is dropped onto the flexible substrate 101 having flexibility and optical transparency to make a cladding layer 206 by forming a thin film on the substrate 101 in accordance with a spin coat method or the like. Subsequently, another polymer material having a higher refractive index than that of the polymer material forming the cladding layer 206 is dropped on the cladding layer 206 to make a core layer 205 by forming a thin film thereon in accordance with a spin coat method or the like, and the resulting core layer 205 is served for the optical waveguide 205. The optical waveguide 205 may be patterned in accordance with a variety of manners such as ultraviolet curing, etching, fabrication and the like. Then, a cladding layer 207 is formed again in accordance with the same manner as that mentioned above in order to protect the core layer 205, and as a result, a flexible optical waveguide section 209 can be fabricated. An inclined end face 208 of the optical waveguide 205 may be processed by molding, cutting or etching. A relative refractive-index difference, core dimensions and the like of the optical waveguide section 209 may be properly decided in response to a proof strength upon increase in radiation loss with respect to bending of the optical waveguide or the substrate, and a tolerance in accuracy of a fitting position in optical coupling of a light emitting element and the optical waveguide.

The electric connector 103 has a plurality of terminals. At least one set of the electro-optic (E/O) conversion section 104, the opto-electric (O/E) conversion section 106, and the optical waveguide 209 is provided on the flexible substrate 101. A transmission channel formed from the electro-optic (E/O) conversion section 104, the opto-electric (O/E) conversion section 106, and the optical waveguide 209 functions as a optical waveguide. Accordingly, such optical waveguide is not adversely affected by electromagnetic noises nor radiates any electromagnetic wave, so that high-quality transmission is possible in even a high-speed signal of 100 Mbit/second or more.

On the other hand, the electric interconnection 102, extending between the electric connectors 103, which does not contain any of the electro-optic (E/O) conversion section 104, the opto-electric (O/E) conversion section 106, and the optical waveguide 209 may transmit a low-speed signal of less than 100 Mbit/second, a power supply voltage and the like.

In the following, operations will be described.

A high-speed signal is input into the driver IC 202 from the electronic module 110 through the electric connector 103 (on the left side of FIG. 5) via the electric interconnection 108. Based on the high-speed signal from the electronic module 110, the driver IC 202 controls light emission of the light emitting element (surface emitting laser) 201.

The surface emitting laser (VCSEL) 201 is flip chip bonded onto the flexible substrate 101 (polyimide or the like) having flexibility and optical transparency, whereby optical signals output from the surface emitting laser (VCSEL) 201 penetrate the flexible substrate 101, and then, input to the optical waveguide 205 provided under the flexible substrate 101. In this case, the end face 208 of the optical waveguide 205 has been processed obliquely so as to have an angle of substantially 45 degrees with respect to a traveling direction of light. Since the obliquely processed surface is in contact with a layer 210 (an air layer in this case) having a different refractive index from that of the optical waveguide 205, an optical signal is reflected by an oblique surface of 45 degrees to be propagated in the optical waveguide 205 along that. On one hand, since the other end face 211 is also processed obliquely so as to have an angle of substantially 45 degrees, the optical signal is again reflected by the 45 degree oblique surface 211, whereby the optical signal changes its propagation direction to the upper direction of FIG. 6A.

The optical signal penetrating the flexible substrate 101 inputs to the light receiving element 203 provided on the top of the flexible substrate 101 to be converted into an electric signal, and then, the electric signal is amplified by the signal amplification IC 204, and the electric signal thus amplified is transmitted to an external module through the electric connector 103.

As described above, when the surface emitting laser (VCSEL) 201 and the flexible substrate 101 having flexibility and optical transparency are used and further, an end face of the optical waveguide section 209 is merely processed as an optical element, the surface emitting laser (VCSEL) 201 can be optically coupled to the light receiving element 203.

FIG. 6B is a sectional view showing another example of the optical waveguide section 209 according to the invention wherein a surface 212 is processed obliquely so as to have substantially 45 degrees with respect to a traveling direction of light, further a metallic film or the like is deposited on the obliquely processed surface to form a light reflection section 213, and an optical component 214 for light reflection is linked to an end face 215 of the optical waveguide section 209. As a result, a process for processing the end face 215 of the optical waveguide section 209 so as to have an angle of substantially 45 degrees is not required, so that an yield can be improved.

According to the above-described constitution of the invention, a photoelectric composite interconnection exhibiting the same easy handling ability as that of a usual electric cable with an electric connector in a communication between electronic modules in an electronics device or a communication between electronics devices themselves, and having excellent flexibility can be realized. Moreover, since the major part of a transmission channel for high-speed signals is served for an optical transmission line, electromagnetic noises are scarcely radiated, it exhibits also excellent noise resistance, and further high-speed and high-capacity transmission of information become possible.

Figure 7:
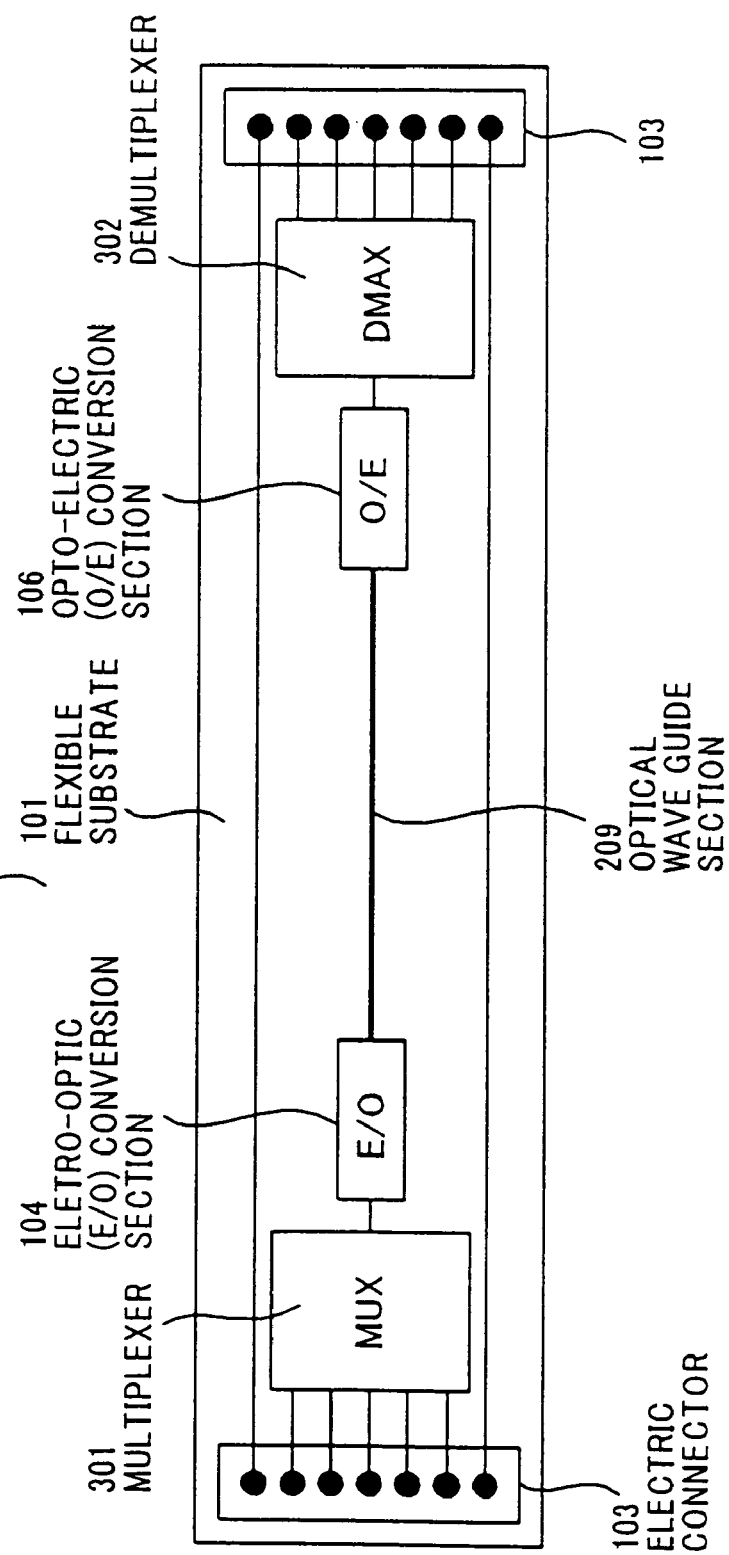
FIG. 7 is a top view showing a photoelectric composite interconnection assembly according to the invention wherein a multiplex and a demultiplexer are provided.

FIG. 7 is a top view showing photoelectric composite interconnection assembly 300 of the invention on which a multiplexer and a demultiplexer are provided wherein the multiplexer (MUX) 301 is provided on a flexible substrate 101 at a position in between one of electric connectors 103 (corresponding to that on the left side of FIG. 5) and an electro-optic conversion (E/O) section 104, while a demultiplexer 302 is provided on the flexible substrate 101 at a position in between the other of the electric connector 103 (corresponding to that on the right side of FIG. 5) and an opto-electric (O/E) section 106.

According to the constitution as described above, signals can be multiplexed and then, transmitted, so that it becomes possible to remarkably increase a transmission capacity. On one hand, when a transmission capacity is not changed, the number of interconnections for optical signals may be reduced, whereby the number of expensive parts to be used such as the electro-optic (E/O) conversion section 104, and the opto-electric (O/E) section 106 can be decreased, and thus, it is advantageous for realization of a low cost.

Figure 8:
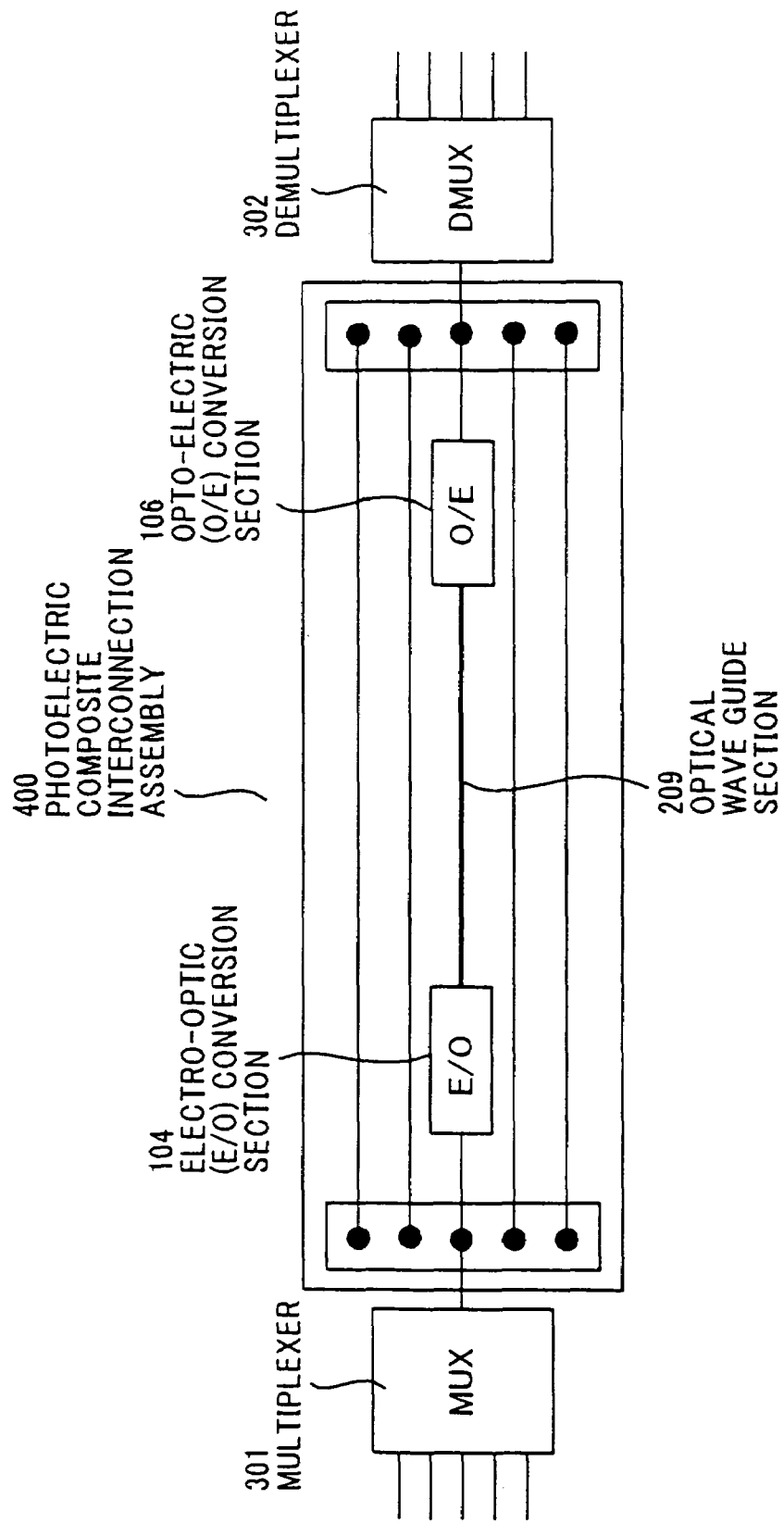
FIG. 8 is a top view showing a photoelectric composite interconnection assembly according to the invention wherein a multiplex and a demultiplexer are provided in the vicinity thereof.

FIG. 8 is a top view showing photoelectric composite interconnection assembly 400 of the invention in the vicinities of which a multiplexer 301 and a demultiplexer 302 are provided wherein the multiplexer (MUX) 301 is provided in the vicinity outside an electric connector 103 (corresponding to that on the left side of FIG. 5), while a demultiplexer (DMUX) 302 is provided in the vicinity outside the other electric connector 103 (corresponding to that on the right side of FIG. 5).

According to the constitution as described above, signals can be multiplexed and then, transmitted, so that it becomes possible to remarkably increase a transmission capacity. On one hand, when a transmission capacity is not changed, the number of interconnections for optical signals may be reduced, whereby the number of expensive parts to be used such as the electro-optic (E/O) conversion section 104, and the opto-electric (O/E) section 106 can be decreased, and thus, it is advantageous for realization of a low cost.

Figure 9:
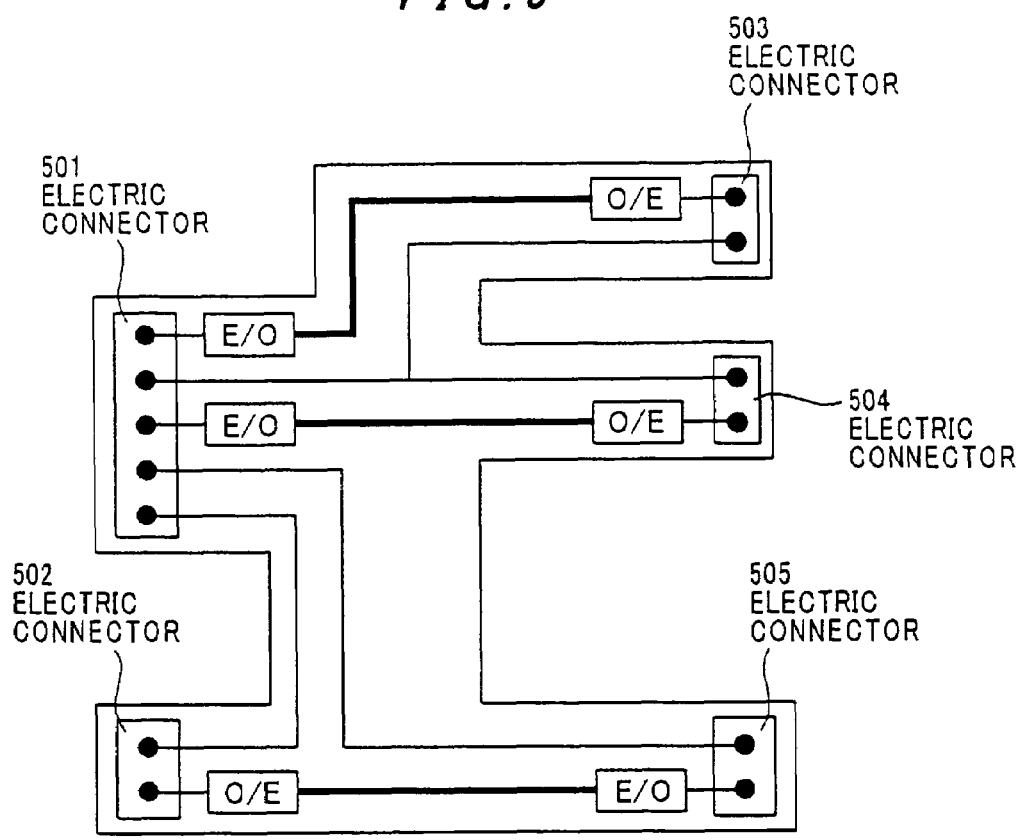
FIG. 9 is a top view showing a photoelectric composite interconnection assembly according to the invention wherein plural electric connectors are provided.

FIG. 9 is a top view showing photoelectric composite interconnection assembly according to the invention on which plural electric connectors (501 to 505) are provided. As a result, a degree of freedom in interconnections becomes high, whereby flexibility is further improved. On one hand, it becomes easy to connect electronics devices each having multiple ports between them.

Figure 10:
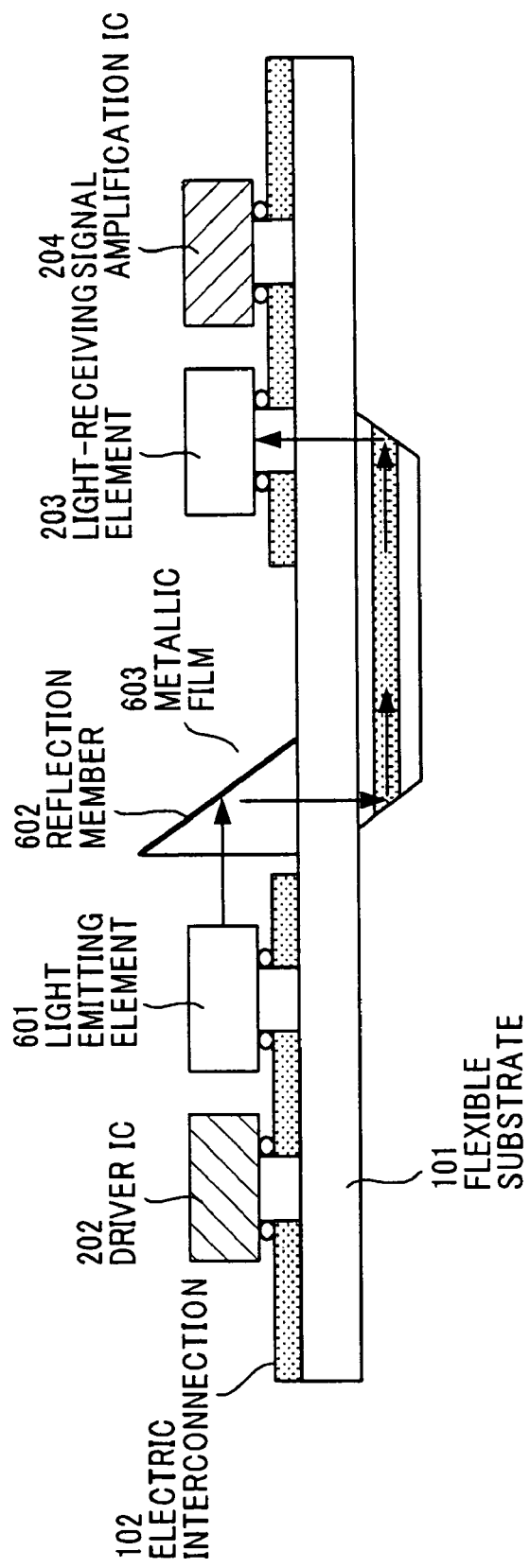
FIG. 10 is a side view showing a photoelectric composite interconnection assembly according to the invention wherein a light emitting element of end-face emission type is provided.

FIG. 10 is a sectional view showing a constitution of photoelectric composite interconnection assembly according to the invention wherein a light emitting element 601 of an end face light emission type is provided on the photoelectric composite interconnection assembly. When a reflection member 602 is disposed in a light output direction of the end face light emitting element 601, an optical path of optical signals is changed towards the lower side of the flexible substrate 101. A behavior after changing the optical path is the same as that of FIGS. 6A and 6B wherein the reflection member 602 is obtained by such a manner that a surface of an optical member made of glass, polymer or the like is processed obliquely, then, a metallic film 603 such as Au is formed on the oblique end face by means of deposition, and the resulting reflection member is fitted to the flexible substrate 101 by the use of an adhesive or the like.

According to the present constitution, it becomes possible to use an inexpensive FP-LD, DFB-LD or the like of an end face light emission type as the light emitting element 601.

Figure 11:
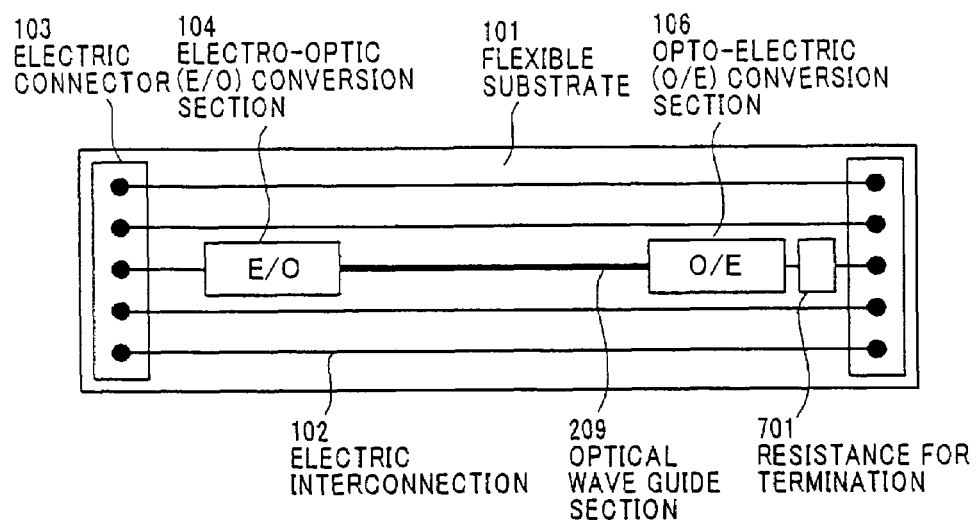
FIG. 11 is a top view showing a photoelectric composite interconnection assembly according to the invention wherein a terminating resistance is provided.

FIG. 11 is a top view showing a photoelectric composite interconnection assembly according to the invention wherein a resistance for termination 701 is fitted to a flexible substrate 101.

When an electric interconnection 102 is lengthened, an impedance in a transmission channel changes, or a inconsistency of impedances arises in case of electrically connecting an electric connector 103 to an external module, whereby reflection appears, and it results in deterioration of electrical signals.

In the present constitution, the termination resistance 701 is provided in the vicinity of an electro-optic (E/O) conversion section 104 or an opto-electric (O/E) conversion section 106 through which high-speed signals propagate to match impedances, whereby reflection of electric signals is suppressed. As a result, a quality of transmission characteristics can be improved, whereby a high-speed and a high-capacity transmission become possible.

Figure 12:
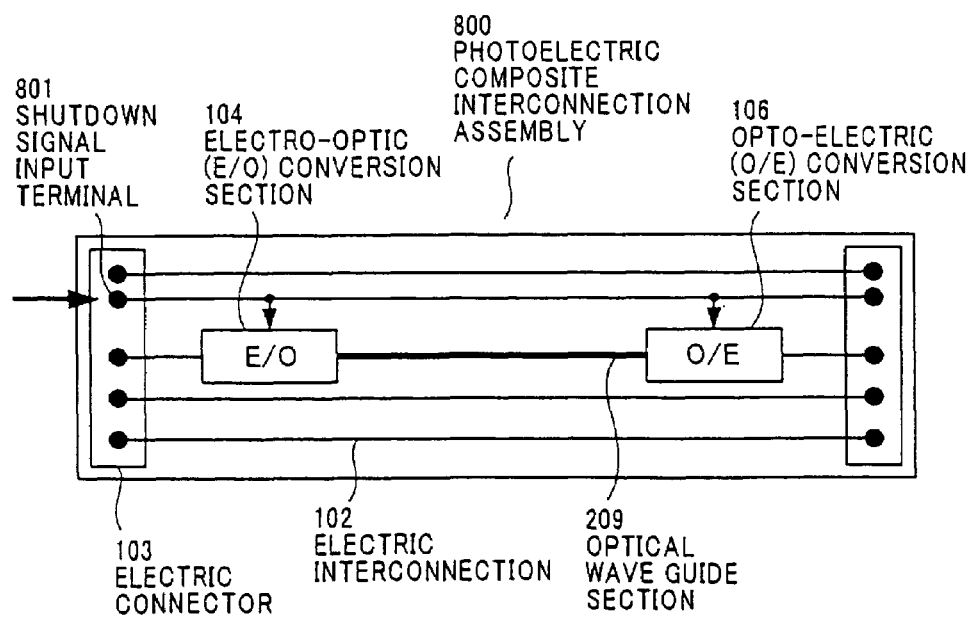
FIG. 12 is a top view showing a further example of a photoelectric composite interconnection assembly according to the invention wherein a shutdown control terminal is provided.

FIG. 12 is a top view showing photoelectric composite interconnection assembly according to the invention wherein a shutdown signal input terminal 801 for controlling shutdown (temporary suppression) of an electro-optic (E/O) conversion section 104 or an opto-electric (O/E) conversion section 106 is provided on the photoelectric composite interconnection assembly 800.

In a case where an optical signal transmission is not implemented, a control signal is input to the shutdown signal input terminal 801 of the photoelectric composite interconnection assembly 800 from an external device (not shown) to shut down the electro-optic (E/O) conversion section 104 and the opto-electric (O/E) conversion section 106.

According to the present constitution, since operations of the electro-optic (E/O) conversion section 104 and the opto-electric (O/E) conversion section 106 are shut down in the case where optical signals are not transmitted, it may be intended to realize electric power saving.

Figure 13:
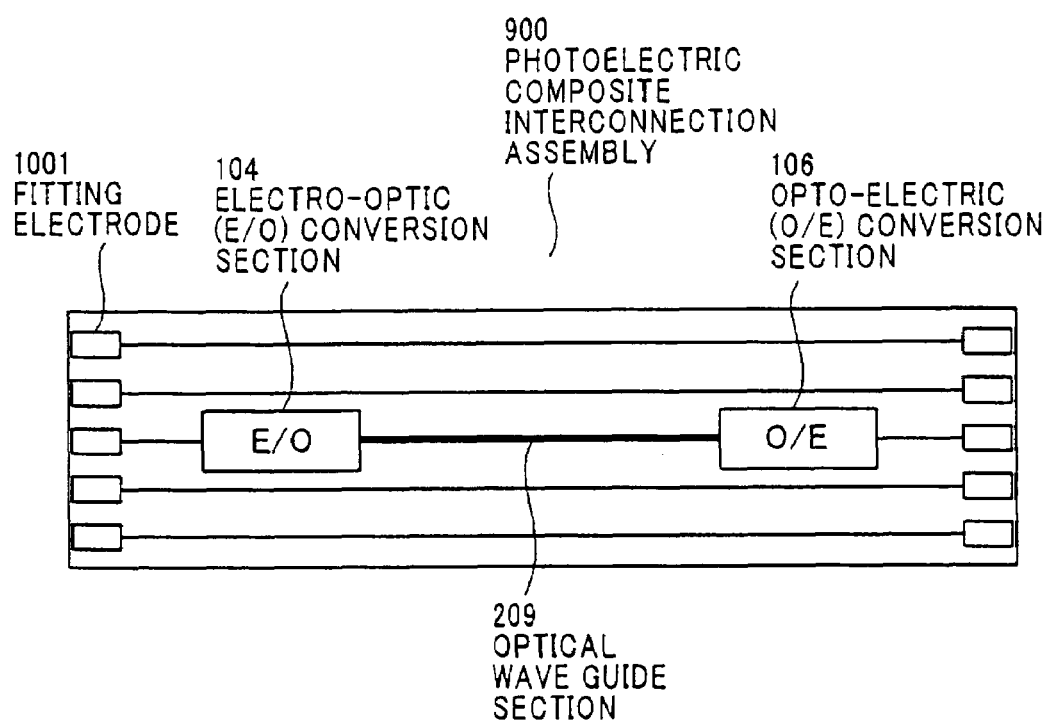
FIG. 13 is a top view showing a further example of a photoelectric composite interconnection assembly of card edge type according to the invention.

FIG. 13 is a top view showing an example of photoelectric composite interconnection assembly 900 to be fitted to a card edge connector according to the invention.

On the photoelectric composite interconnection assembly 900 to be fitted to a card edge type connector, fitting electrodes 1001 are formed in the vicinities of an end face of the photoelectric composite interconnection assembly 900, whereby it may be directly fitted with an electric connector (not shown) of other end of the line. Accordingly, soldering of electric connectors 103 in the photoelectric composite interconnection assembly 900 to be fitted to a card edge type connector becomes not necessary. Thus, a heat resistance demanded in electronics parts and a light emitting element, which is the one required for preventing thermal destruction due to heat-resisting solder in case of soldering the electric connector 103, may be moderated.

As a result, inexpensive electronics parts and light emitting elements may be used for the electro-optic (E/O) conversion section 104 and the opto-electric (O/E) conversion section 106.

It is to be noted that the example of the photoelectric composite interconnection assembly 900 to be fitted to a card edge type connector is not limited to that of FIG. 13, but such modifications that the electric connectors 103 of the photoelectric composite interconnection assembly shown in FIGS. 5 through 12 are replaced by fitting electrodes 1001 may be made, whereby all of the photoelectric composite interconnection assembly can be fitted to a connector of card edge type.

Moreover, when the photoelectric composite interconnection assembly of the invention is applied to a folding part of, particularly, electronics devices, it becomes possible to flexibly correspond to folding actions, besides it becomes also possible that communications between electronics devices disposed so as to sandwich the folding part in between them can be performed at high speed in high capacity and high quality. A specific example of applicable electronics devices includes optical communication equipment such as optical transceiver; and communication equipment such as personal computers, and cellular phones.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A photoelectric composite interconnection assembly, comprising:
    a flexible substrate comprising an electric interconnection; and
    an electrical interface provided at both ends of the electric interconnection;
    wherein a part of the electric interconnection is replaced by an optical transmission line,
    wherein the electric interconnection is disposed on a first side of the flexible substrate and the optical transmission line is disposed on a second side of the flexible substrate.

2. The photoelectric composite interconnection assembly according to claim 1, wherein:
    the electric interconnection is formed on the flexible substrate and replaced by the optical transmission line at an intermediate section thereof, and the optical transmission line comprises a pair of optical element sections and a flexible optical waveguide that optically connects between the pair of optical element sections.

3. The photoelectric composite interconnection assembly according to claim 1, wherein:
    the electrical interface comprises an electric connector and/or an electrode, and the electrode is connectable with an external card edge connector.

4. The photoelectric composite interconnection assembly according to claim 2, wherein:
    the pair of optical element sections comprises an electro-optic (E/O) conversion section and an opto-electric (O/E) conversion section, the electro-optic (E/O) conversion section is electrically connected to the electrical interface provided at the one end of the electric interconnection, the opto-electric (O/E) conversion section is electrically connected to the electrical interface provided at the other end of the electric interconnection, and the optical waveguide is disposed between the electro-optic (E/O) conversion section and the opto-electric (O/E) conversion section to optically connect therebetween.

5. The photoelectric composite interconnection assembly according to claim 4, wherein:
the electro-optic (E/O) conversion section comprises a surface emitting laser.

6. The photoelectric composite interconnection assembly according to claim 5, wherein:
the surface emitting laser is flip-chip mounted on the flexible substrate.

7. The photoelectric composite interconnection assembly according to claim 2, wherein:
the pair of optical element sections comprises plural pairs of optical element sections formed on the flexible substrate, and each of the plural pairs of optical element sections forms an optical transmission line with the corresponding flexible optical waveguide optically connecting between the pair of optical element sections.

8. The photoelectric composite interconnection assembly according to claim 4, further comprising:
a multiplexer for multiplexing plural electric signals provided between the electrical interface and the electro-optic (E/O) conversion section, and a demultiplexer for demultiplexing multiplexed electric signals provided between the electrical interface and the opto-electric (O/E) conversion section.

9. The photoelectric composite interconnection assembly according to claim 4, further comprising:
a multiplexer for multiplexing plural electric signals externally connected to the electrical interface provided on the side of the electro-optic (E/O) conversion section, and a demultiplexer for demultiplexing multiplexed electric signals externally connected to the electrical interface on the side of the opto-electric (O/E) conversion section.

10. The photoelectric composite interconnection assembly according to claim 1, further comprising:
a terminating resistance provided on the flexible substrate.

11. An electronics device, comprising:
the photoelectric composite interconnection assembly according to claim 1,
wherein the photoelectric composite interconnection assembly forms a transmission line between substrates or electronic modules that compose the electronics device.

12. The photoelectric composite interconnection assembly according to claim 1, wherein:
the electric interconnection is disposed only on the first side of the flexible substrate.

13. The photoelectric composite interconnection assembly according to claim 1, wherein:
the electric interconnection is disposed on an opposite side of the flexible substrate from the optical transmission line.

14. The photoelectric composite interconnection assembly according to claim 1, wherein:
the optical transmission line is disposed on the second side of the flexible substrate in a location substantially under the first side of the flexible substrate where no electric component is disposed.

15. The photoelectric composite interconnection assembly according to claim 1, wherein:
the electrical interconnection is disposed on a side of the flexible substrate other than a side on which the optical transmission line is disposed.

* * * * *